United States Patent [19]
Hirase et al.

[11] Patent Number: 5,362,982
[45] Date of Patent: Nov. 8, 1994

[54] INSULATED GATE FET WITH A PARTICULAR LDD STRUCTURE

[75] Inventors: Junji Hirase; Takashi Hori, both of Osaka, Japan

[73] Assignee: Matsushita Electric Industrial Co., Ltd., Osaka, Japan

[21] Appl. No.: 40,196

[22] Filed: Apr. 1, 1993

[30] Foreign Application Priority Data

Apr. 3, 1992 [JP] Japan .................................. 4-081812

[51] Int. Cl.$^5$ .................... H01L 29/78; H01L 29/784
[52] U.S. Cl. .................................... 257/408; 257/344; 257/336
[58] Field of Search ................ 257/408, 344, 336, 487

[56] References Cited

U.S. PATENT DOCUMENTS 4,649,629  3/1987  Miller et al. ......................... 257/408
4,746,624  5/1988  Cham et al. ............................ 437/44

FOREIGN PATENT DOCUMENTS 3283461 12/1991 Japan .................................... 257/408

OTHER PUBLICATIONS

Hori, "½-μm LATID (LArge-Tilt-angle Implanted Drain) Technology for 3.3-V Operation", 1989 IEEE, pp. 32.4.1-4.

Primary Examiner—Rolf Hille
Assistant Examiner—Wael Fahmy
Attorney, Agent, or Firm—Willian Brinks Hofer Gilson & Lione

[57] ABSTRACT

A lightly doped source and a lightly doped drain are formed at a region which is adjacent to a heavily doped source and a heavily doped drain of FET and all or a part of which is under a gate electrode. In the lightly doped source and the lightly doped drain, an effective impurity atom concentration is gradually lowered from an inside of a substrate toward a surface thereof. Accordingly, a capacity between the gate and the drain is reduced and an operation speed of a circuit is enhanced. Hot carrier is generated at a deeper portion, which leads to an improvement for hot-carrier immunity. In a method of manufacturing it, only by changing conditions of implant and heat-treatment at manufacturing an FET with a conventional LATID structure the impurity atom concentration profile is improved. The effective impurity atom concentration at surfaces of lightly doped source and drain can be lowered by counter-doping.

4 Claims, 14 Drawing Sheets

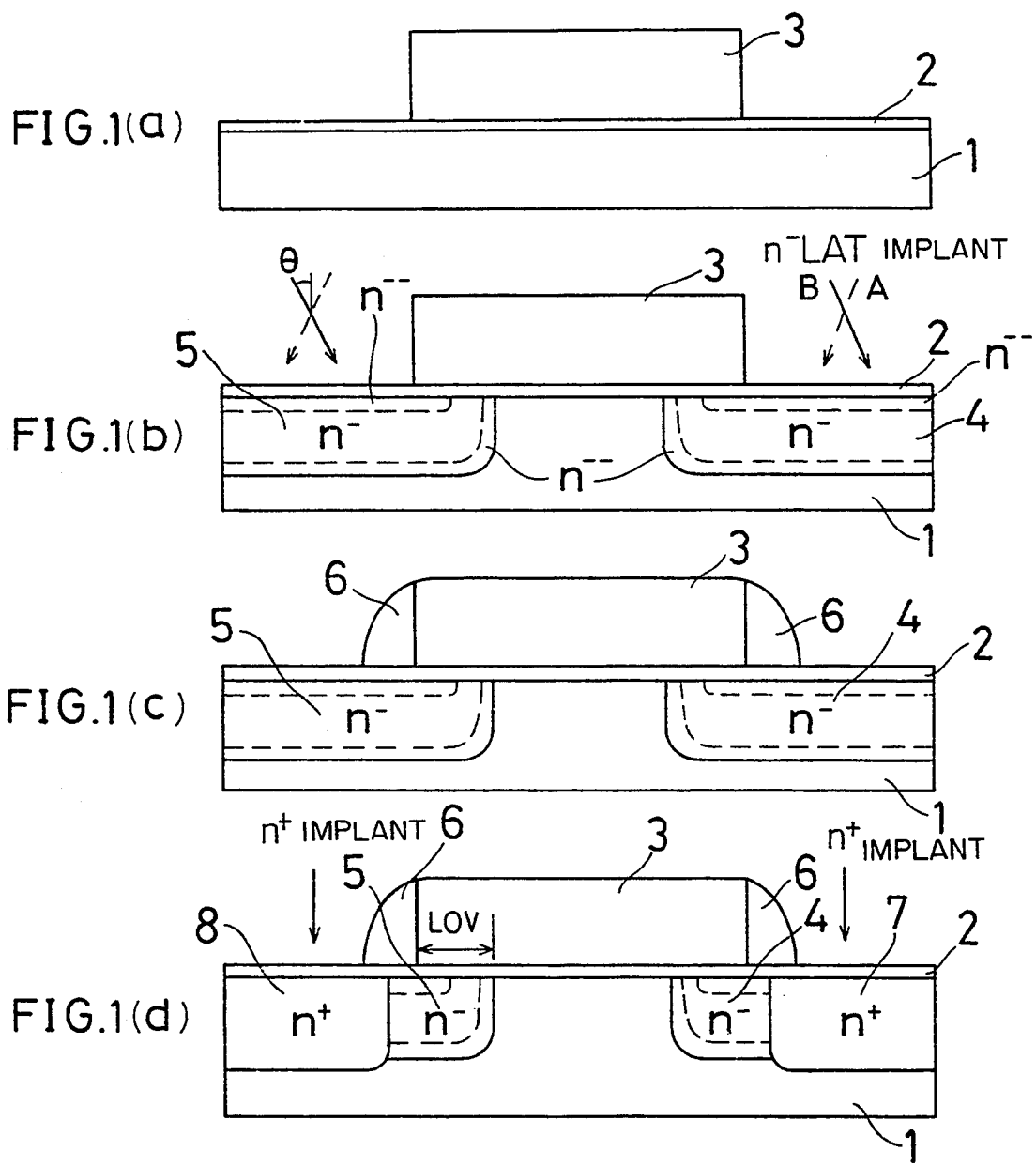

INSULATED GATE FET WITH A PARTICULAR LDD STRUCTURE

BACKGROUND OF THE INVENTION

This invention relates to a semiconductor device having an insulated gate field-effect transistor, and particularly relates to an improvement in an operation speed thereof.

Conventionally, especially in an n-channel type MOS transistor, an LDD (lightly doped drain) structure in which an impurity atom concentration near a channel of a drain region is made low by implanting ion into heavily doped source and drain regions after providing side walls (spacers) at a gate electrode is applied in order to have high drain breakdown voltage. In this structure, since the lightly doped drain reduces an electric field near the drain, high reliability in durability to high the drain is obtained. However, in the general MOS transistor with LDD structure, almost part of the lightly doped drain is located outside of the gate electrode, so that the region therein located outside of the gate is pinched off to have high resistivity. This causes degradation in drive current. Further, since a hot carrier is generated below the side walls and is implanted into and held in the side walls, the lightly doped drain is pinched off to have higher resistivity. As a result, the degradation in drive current due to the hot carrier is caused in an earlier stage than a single source/drain structure ("spacer-induced degradation").

As disclosed in IEDM Technical Digest, 1989, p.777 (see FIG. 13), a MOS transistor with LATID (large-angle-tilt implanted drain) structure is proposed as a modified transistor with LDD structure. In detail, the lightly doped source 4 and the lightly doped drain 5 are formed below a near-end part of the gate electrode 3, mainly not below the spacers 6, by two-step wise implant with a tilted angle of 45°, instead of a conventional ion implant at an angle approximately in parallel with a normal of the substrate (usually 7° for preventing channeling). Accordingly, the MOS transistor with LATID structure is prevented from having high resistivity caused by the pinch off of the lightly doped drain. Thus, the transistor with LATID structure has much higher drivability and higher reliability than that with LDD structure.

FIGS. 14(a) and (b) show respective results of two-dimensional simulation near the drain in electric field $E_{//}$ (MV/cm) in a lateral direction, electron concentration Ne (cm$^{-3}$) and generation frequency Rg (cm$^{-3}$,s$^{-1}$) of pairs of hot carriers for the MOS transistor with LATID structure and that with LDD structure. Hatched regions are regions whose hot carrier pair generation frequencies Rg are more than $10^{28}$. The impurity atom concentration of the substrate is about $1 \times 10^{17}$cm$^{-3}$. Wherein biassing conditions are as follows: drain voltage Vd=5 V, gate voltage Vg=2 V and substrate voltage Vsub=0 V. At these biassing conditions a drain avalanche hot carrier is generated, which causes the severest degradation of the n-channel type MOS transistor. When the gate voltage Vg is smaller than the drain voltage Vd, the drain region near the gate electrode is depleted, and electric current is deflected around the depletion region. In the MOS transistor with LATID structure, the current is deflected around the depletion and flows in a deeper part, so that the hot carrier is generated at a deeper point. As a result, the generated hot carrier is likely to be scattered and is hard to be implanted into a gate oxide layer. On the other hand, with LDD structure, the depletion region is small and is formed far from a point to which the electric field concentrates. Therefore, the current flows near the surface with less influence of the depletion region, so that the hot carrier is generated near the surface. This is one of the reasons why the MOS transistor with LATID structure has high reliability. With LDD structure, the point which electric field concentrates is located under the side wall to generate "spacer-induced degradation".

In the MOS transistor with LATID structure, however, the lightly doped source and the lightly doped drain extend under the gate electrode, which means that the source and the drain are formed at a shallower part with respect to the surface of the substrate. Therefore, the LATID structure cannot fully display its effect. Moreover, the longer an overlap length Lov between the gate and the drain is, the larger a capacity Cgd between the gate and the drain is, with a result that a circuit operation speed cannot correspond to an increased drivability.

U.S. Pat. No. 4,746,624 discloses a BLDD (buried lightly doped drain) structure (see FIG. 15) and a method of making the same. In the BLDD structure, less hot carrier is implanted into and held in the side wall and the drive current is prevented from degradation in such a manner that in LDD structure a buried drain of a third region whose impurity atom concentration is higher than that of the lightly doped drain and lower than that of the heavily doped drain is provided in the substrate at a portion set-distance deep from the substrate surface so that the portion at which the hot carrier is generated is far from the substrate surface. In the method, the buried drain is shifted back and a fourth region, i.e., a blocking region of n− (or p or intrinsic semiconductor) which has high resistivity is provided at a boundary of the lightly doped drain and the heavily doped drain in order to decrease a short channel effect generated in BLDD structure (see FIG. 11).

However, in BLDD structure, when the channel length is short accompanied by scaling down the semiconductor device, a punch-through is likely to occur along a route shown by an arrow in broken line in FIG. 16, which means severe short channel effect (refer to the U.S. Patent). Particularly, even when the buried drain is provided so as to overlap under the gate electrode to avoid to have high resistivity due to the pinch-off, the gate/drain capacity of the lightly doped source and the lightly doped drain is large. Consequently, as well as LATID structure, the operation speed is hardly enhanced.

The U.S. Pat. No. 4,746,624 approaches to suppress the short channel effect which is the disadvantage of the BLDD structure. The method therein has complicated steps of forming a gate electrode, forming lightly doped source and drain, forming a first side wall, forming a blocking region B by counter doping, forming a second side wall and forming heavily doped source and drain. Further, the boundary of the lightly doped drain and the heavily doped drain is located under the side wall, so that the blocking region B is not formed under the gate electrode. Therefore, since the current flows at a deeper part under the side wall which the gate voltage hardly affects, further lowering of the current drivability may be caused with less improvement in the operation speed.

With the above LDD, LATID and BLDD structures, the gate/drain capacity cannot be reduced and improvement in the operation speed of the semiconductor device is limited because the effective impurity atom concentration is made increased from the inside of the substrate toward the surface thereof at the surface of lightly doped source and drain regions. This invention is made in view of this disadvantage and has its object of enhancing the reliability and contemplating the high speed operation of the transistor without degradation of short channel effect by making the effective impurity atom concentration lowered from the inside of the substrate toward the surface thereof in lightly doped source and drain regions in a transistor with LATID structure.

SUMMARY OF THE INVENTION

To attain the above object, a semiconductor device functioning as an insulated gate field-effect transistor, comprises; a one-kind conductive type semiconductor substrate; a heavily doped source region and a heavily doped drain region to which impurity of reverse-conductive type to that of the semiconductor substrate is doped; and a lightly doped source region and a lightly doped drain region, adjacent to the heavily doped source region and the heavily doped drain region, at least a part of which is provided at a portion under a near-end part of a gate electrode, the lightly doped source region and the lightly doped drain region being of same conductive type as the heavily doped source region and the heavily doped drain region, and having lower effective impurity atom concentration (also referred to as impurity concentration) than that of the heavily doped source region and the heavily doped drain region; wherein the effective impurity atom concentration of the portion under the near-end pare of the gate electrode in at least one of the lightly doped source region and the lightly doped drain region is made gradually lowered from an inside of the substrate toward a surface thereof.

Accordingly, excellent current drivability equivalent to that of the transistor with LATID structure is maintained, and the gate/drain capacity is decreased owing to low effective impurity atom concentration at the substrate surface in the lightly doped source region or the lightly doped drain region, thus enhancing the circuit operation speed. Further, since a hot carrier generating region is deeper from the substrate surface than that in the MOS transistor with LATID structure and implant of the generated hot carrier to a gate oxide layer is prevented by scattering, a hot-carrier immunity is improved, namely the operation speed is enhanced with high reliability.

In a region of the lightly doped source region and the lightly doped drain region where the effective impurity atom concentration is made gradually lowered from the inside of the substrate toward the surface thereof, the effective impurity atom concentration is peaked at a portion 0.01 to 0.2 $\mu$m deep from the substrate surface.

Accordingly, the hot-carrier immunity is improved because the high effective impurity atom concentration region to generate a hot carriers is located deeper from the substrate surface than a mean free path of the hot carrier.

A doped high-threshold voltage region which is same conductive type as the semiconductor substrate and has higher effective impurity atom concentration than the substrate is doped is provided at a region near a surface which connects a channel of the transistor to the portion under the end part of the gate electrode aside at least one of the lightly doped source region and the lightly doped drain region.

Accordingly, the short channel effect is suppressed since occupation of the high-threshold region becomes large accompanied by scaling down semiconductor device, namely, by shortening the channel.

A method of making a semiconductor device functioning as an insulated gate field-effect transistor at a one-kind conductive type semiconductor substrate, comprises the steps of; forming a gate electrode on a gate insulator film formed at a part to be a region of the insulated gate field-effect transistor on a surface of the substrate; implanting impurity of reverse-conductive type to that of the substrate over the surface of the substrate, using the gate electrode as a mask so as to form a lightly doped source region; implanting impurity of reverse-conductive type to that of the substrate over the surface of the substrate, using the gate electrode as a mask so as to form a lightly doped drain region; implanting ion whose concentration is higher than that at the steps of ion implanting to the lightly doped source region and to the lightly doped drain region, using the gate electrode as a mask so as to form a heavily doped source region and a heavily doped drain region; and conducting a heat treatment to the substrate obtained after the respective steps are carried out, wherein at least at one of the steps to form the lightly doped source region and to form the lightly doped drain region, an impurity implanting direction is tilted largely with respect to a normal of the substrate so that the impurity is implanted into an inside part of the substrate under the gate electrode, and the effective impurity atom concentration near a surface of the substrate is made lower than that at an inside thereof at a portion under an end of the gate electrode in the region after the step of conducting the heat-treatment.

Accordingly, only by changing implanting conditions at manufacturing a conventional transistor with LATID structure, the effective impurity atom concentration near the surface of the portion under the near-end part of the gate electrode in at least the lightly doped source region or the lightly doped drain region is made lowered, without additional manufacturing step. Thus, the operation speed is enhanced with high reliability.

In the region of the lightly doped source region and the lightly doped drain region of the insulated gate field-effect transistor where the impurity is implanted with the largely tilted angle, the steps of implanting and conducting the heat-treatment are carried out so that the impurity atom concentration is peaked at a portion 0.01 to 0.2 $\mu$m deep from the substrate surface.

Accordingly, the transistor with excellent hot-carrier immunity is obtained without additional manufacturing step.

The method of making a semiconductor device further comprises the step of implanting impurity whose conductive is same as that of the substrate and impurity atom concentration is low to the region of the lightly doped source or the lightly doped drain where the impurity is implanted with the largely tilted angle, over the substrate surface, using the gate electrode as a mask, with more tilted angle with respect to the normal of the substrate than that at each implanting step so as to make a surface of the region a counter-doped region whose conductive type is reverse to that of the substrate and whose effective Impurity atom concentration is extremely low.

Accordingly, since the surface of the lightly doped source or the lightly doped drain where the effective impurity atom concentration is made lowered is the counter-doped region, the effective impurity atom concentration near the surface is further lowered. Therefore, the effective impurity atom concentration is easy to be precisely adjusted for further decreasing the gate/drain capacity.

A method of making a semiconductor device functioning as an insulated gate field-effect transistor at a one-kind conductive type semiconductor substrate, comprises the steps of: forming a gate electrode on a gate insulator film formed at a part to be a region of the insulated gate field-effect transistor on a surface of the substrate; implanting ion of reverse-conductive type to the substrate, using the gate electrode as a mask so as to form a lightly doped source region on the substrate surface; implanting ion of reverse-conductive type to the substrate, using the gate electrode as a mask so as to form a lightly doped drain region on the substrate surface; implanting impurity of same conductive type as that of the substrate into the substrate surface under the gate electrode in at least one of the lightly doped source region and the lightly doped drain region over the substrate surface, using the gate electrode as a mask, with a largely tilted angle with respect to a normal of the substrate so as to form a counter-doped region on a surface under a near-end part of the gate electrode in the region; and implanting higher-concentration ion than that at the steps of ion implanting to the lightly doped source region and to the lightly doped drain region, using the gate electrode as a mask, so as to form a heavily doped source region and a heavily doped drain region, wherein in the counter-doped region the effective impurity atom concentration near a surface of the substrate is made lower than that at the inside thereof.

Accordingly, since the counter-doped region whose effective impurity atom concentration is low is formed near the surface of the lightly doped source region or the lightly doped drain region of the transistor with almost the same structure as LATID structure, the ion implanting conditions to form the lightly doped source region or the lightly doped drain region is comparatively simple, which facilitates the manufacturing processes.

The method of making a semiconductor device, further comprises the step of implanting impurity, whose conductive type is same as that of the substrate and whose impurity atom concentration is higher than that of the substrate, into the surface part of a portion connecting a channel to at least one of the lightly doped source region and the lightly doped drain region, using the gate electrode as a mask, with a more largely tilted angle with respect to the normal of the substrate so as to form a high-threshold voltage region of same conductive type as that of the substrate.

Accordingly, only by changing the impurity atom concentration and the impurity implanting angle for counter-doping, the high-threshold voltage region is formed at the portion connecting the channel to the tightly doped source region or the lightly doped drain region where the effective impurity atom concentration at the surface is low. Thus, the semi-conductor device is reduced in size easily without degradation of short channel effect.

BRIEF DESCRIPTION OF THE DRAWINGS

FIGS. 1(f)-(d) are sections showing processes of manufacturing a MOS transistor according to a first embodiment.

PREFERRED EMBODIMENT OF THE INVENTION

Figure 2A:
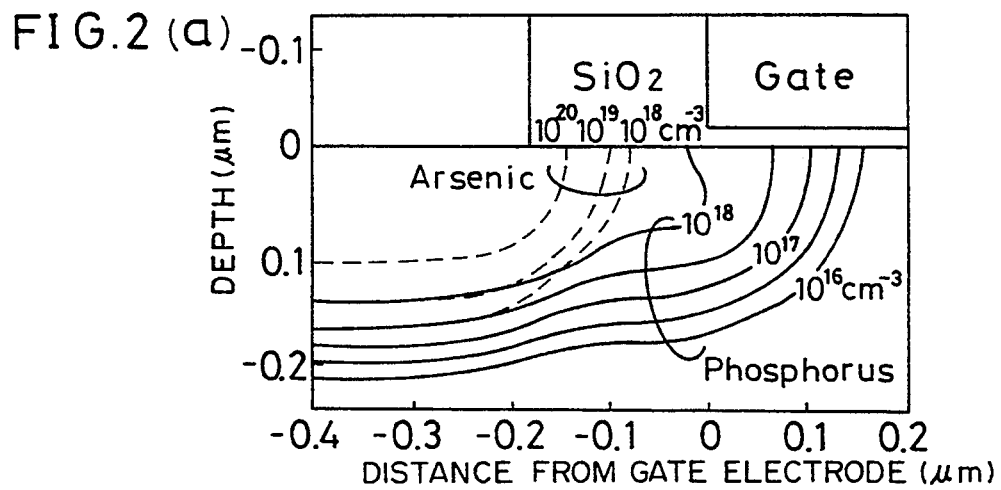
FIGS. 2(a)-(b) are diagrams respectively showing a two-dimensional impurity atom concentration profiles near a drain after the processes of the MOS transistor according to the first embodiment and a conventional MOS transistor with LATID structure.

Description is made below about embodiments of the present invention, with reference to accompanying drawings.

FIRST EMBODIMENT

FIGS. 1(a)-(d) show a semiconductor device and a manufacturing processes thereof in the first embodiment.

As shown in FIG. 1(a), after a 16 nm gate oxide layer 2 is formed on a surface of a p-type Si (silicone) substrate 1 whose impurity atom concentration is, for example, $3 \times 10^{16}$ cm$^{-3}$, a polysilicon film is formed and a gate electrode 3 (gate length Lg=0.8 μm) is formed by selectively conducting anisotropic etching using a photoresist film or the like.

Then, as shown in FIG. 1(b), phosphorus ion is implanted using the gate electrode 3 as a mask to form a lightly doped source 4 and a lightly doped drain 5. Direction of the ion implant is tilted at a large angle $\theta$ (about 25°, for example) with respect to a normal of the substrate 1 surface and the implanting direction at the formation of lightly doped source 4 is symmetrical with that at the formation of lightly doped drain 5. In other words, the ion is implanted from the source side (arrow A in broken line), then is implanted from the drain side (arrow B in solid line). Since the obliquely implanted phosphorus ion has a given energy, each impurity atom concentration under a near-end part of the gate electrode 3 within the lightly doped source region 4 and the lightly doped drain region 5 is extremely low (n$^{--}$) near the surface of the substrate 1; low (n$^{-}$), but higher than that near the surface, at a portion set-distance deep from the surface; and extremely low (n$^{--}$) at a deeper portion.

Next, as shown in FIG. 1(c), after a silicone oxide layer is laminated by means of chemical vapor deposition (CVD), the anisotropic etching is conducted to form side walls 6 aside the gate electrode 3.

High-concentration arsenic ion is implanted using the gate electrode 3 and the side walls 6 as a mask, as shown in FIG. 1(d), to form a heavily doped source 7 and a heavily doped drain 8, respective impurity atom concentrations of which are higher than that of the lightly doped source 4 and the lightly doped drain 5. Finally, a heat treatment at 900° C. is conducted for 90 minutes. At this time, impurities which is implanted at the above step is dispersed so that in the lightly doped source 4 and the lightly doped drain 5 under the near-end part of the gate electrode 3, each effective impurity atom concentration is made gradually lowered from the inside of the substrate toward the surface thereof and the portion set-distance deep from the substrate surface (for example, as about one half to one fourth deep as the depth of the heavily doped source 7 or the heavily doped drain 8) has a peak of effective impurity atom concentration (for example, as about 1.7 times as that near the surface).

In this way, though the MOS transistor in this embodiment is manufactured basically in the same manner as a conventional MOS transistor with LATID structure, the lightly doped source 4 and lightly doped drain 5 are formed partially or fully under the gate electrode 3 by adequately setting the angle $\theta$ of ion implant, dose D and energy Ei at the step in FIG. 1(b). Therefore, an impurity atom concentration profile having a peak at the portion set-distance deep from the surface under the near-end part of the gate electrode 3 is obtainable after all processes.

FIGS. 2(a) and (b) show two-dimension impurity atom concentration profiles near the drains after all processes of equalizing the effective dose Neff=D-—COS $\theta$ and the overlap length Lov of the drain and the gate for the MOS transistor of this embodiment ($\theta$=25°, D=2.3×10$^{13}$ cm$^{-2}$, Ei=60keV, Neff=2.1×10$^{13}$ cm$^{-2}$ and Lov=0.18 μm) and for a conventional MOS transistor with LATID structure ($\theta$=45°, D=3.0×10$^{13}$ cm$^{31}$ $^2$, Ei=50 keV, Neff=2.1×10$^{13}$ cm$^{-2}$ and Lov=0.18 μm). FIG. 2(c) shows respective impurity atom concentration profiles in a depth direction under the end part of the gate electrode of the transistors. It is cleared from the figures that in the lightly doped source 4 and the lightly doped drain 5 under the near-end part of the gate electrode 3, the effective impurity atom concentration is made gradually lowered from the inside toward the surface of the substrate and is peaked at about 0.06 μm depth from the gate oxide layer 2 in the MOS transistor of this embodiment, even though the heat treatment at 900° C. for 90 minutes is conducted after the ion implant. In other words, different from LATID structure, the effective impurity atom concentration is gradually lowered from the inside of the substrate toward the surface thereof even under the same heat treatment conditions by setting the impurity implanting angle $\theta$ large but smaller than the impurity implanting angle in the LATID structure and by setting implanting energy slightly larger. According to the heat treatment conditions, it is possible with less implanting energy to form a impurity atom concentration profile that the effective impurity atom concentration is gradually lowered from the inside of the substrate toward the surface thereof.

Figure 2B:
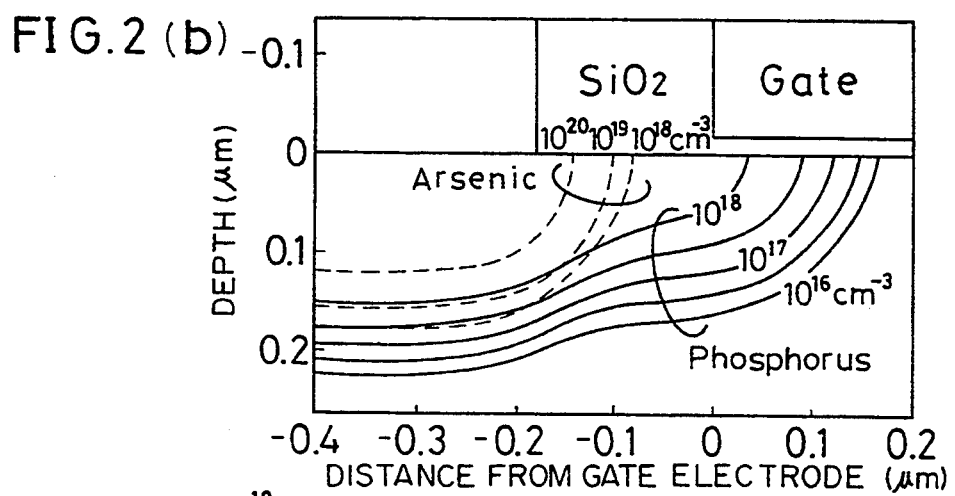
Figure 2C:
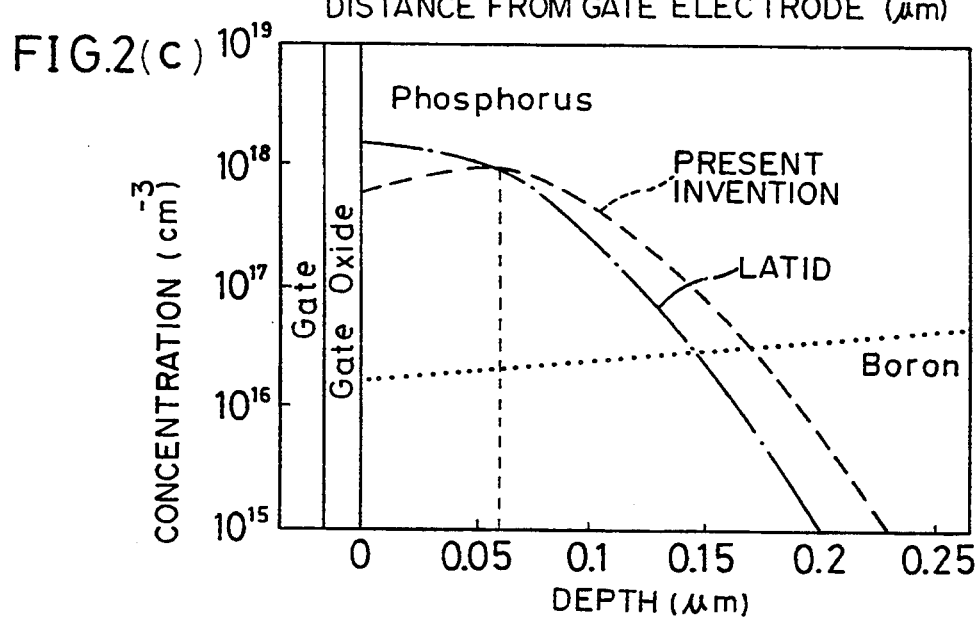
FIG. 2(c) is a diagram showing each impurity atom concentration profile of the MOS transistor according to the first embodiment and a conventional MOS transistor with LATID structure at the end part of a gate electrode of the transistors in a depth direction.
Figure 3A:
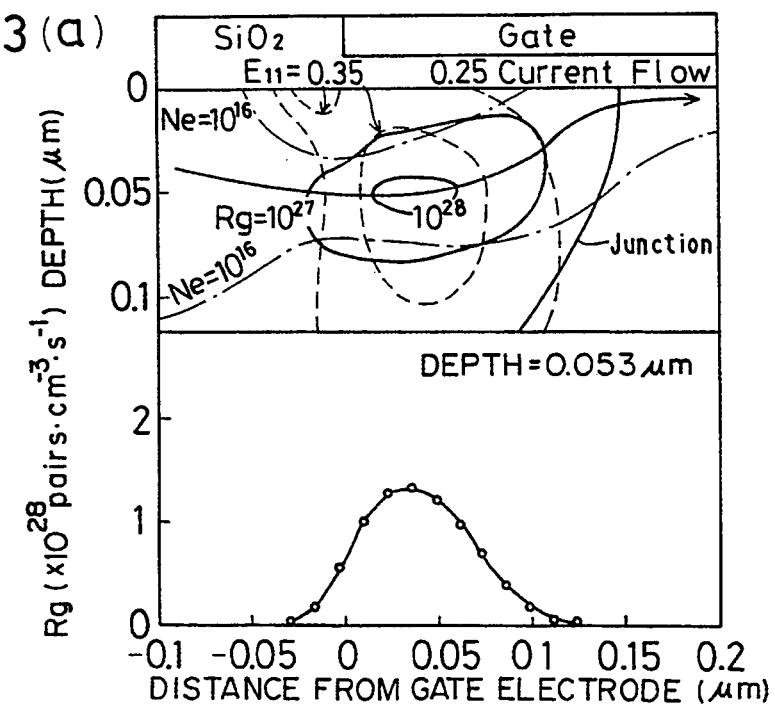
FIGS. 3(a) and (b) are diagrams upper parts of which illustrate electric yield $E_{//}$ in a lateral direction, electron concentration Ne and generation frequency Rg of hot carrier pairs obtained by two-dimensional simulation near the drain and lower parts of which illustrate distribution in the lateral direction of the hot carrier pairs generation frequency Rg at a peak thereof respectively for the MOS transistor according to the first embodiment and the conventional MOS transistor with LATID structure.
Figure 3B:
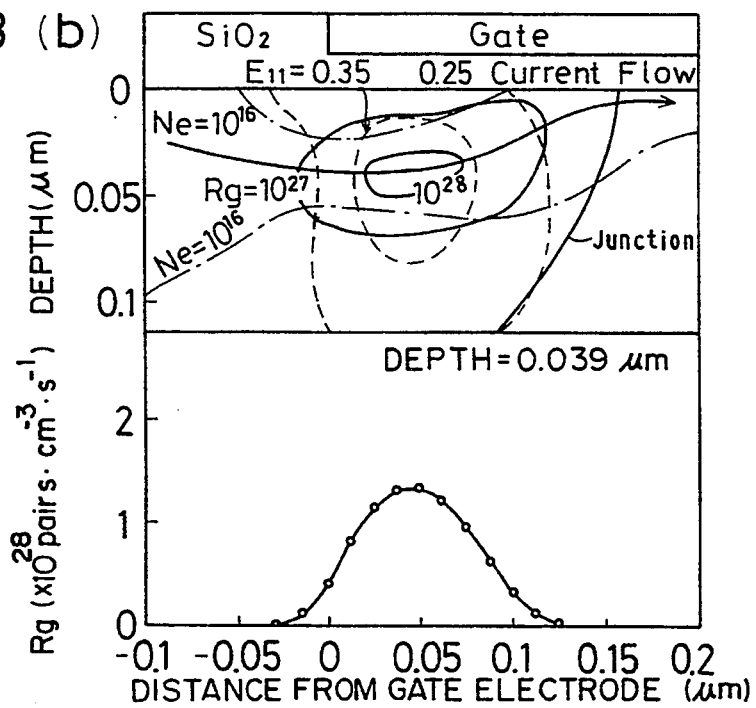

FIGS. 3(a) and (b) show respective results of a two-dimension simulation near the drains of electric field E//(MV/cm) in a lateral direction, electron concentration Ne (cm$^{-3}$) and hot carrier pairs generation frequency Rg (cm$^{-3}$.s$^{-1}$) under the same conditions as in FIG. 2 for the MOS transistor in the embodiment and for a conventional MOS transistor with LATID structure. Lower parts of the figures show distribution in the lateral direction of hot carrier pairs generation frequency Rg at a peak thereof. Wherein, each impurity atom concentration of the substrates is about 1×10$^{16}$ cm$^{-3}$ The biassing conditions are as follows: the drain voltage Vd is 7 V, the gate voltage Vg is 2 V, and the substrate voltage Vsub is −2 V. Under such biassing conditions, drain avalanche hot carrier is generated which causes the severest degradation of the n-channel type MOS transistor. The lightly doped drain 5 right below the gate electrode is depleted when the gate voltage is smaller than the drain voltage. Compared with the conventional MOS transistor with LATID structure (FIG. 3(b)), the depletion in the MOS transistor of this embodiment is expanded (FIG. 3(a)) because the impurity atom concentration of the lightly doped drain 5 near the surface under the near-end part of the gate electrode is made low. Therefore, in addition that the region has high resistivity owing to the low impurity atom concentration, the resistivity thereof is made further high because of the depletion, which makes the current flow farther from the surface. Thus, the portion at which the hot carrier is generated is made farther from the surface and is hard to be implanted to the gate oxide layer 2 and the like because of the dispersion of the generated hot carrier (hole in this case), thus improving a hot-carrier immunity. In detail, the MOS transistor in this embodiment has its peak point of the hot carrier pairs generation frequency Rg at 0.053 $\mu$m deep from the substrate surface, which is 0.014 $\mu$m deeper than that of the conventional MOS transistor with LATID structure (0.039 $\mu$m) though the maximum value thereof is equal to that with LATID structure. This depth difference is large enough with respect to a mean free path (about 0.005 $\mu$m) of the hole in the silicone. A probability that the hot carrier is implanted to the gate oxide layer 2 and the like is decreased with a ratio of 1/e (wherein "e" is a base of natural logarithm) per mean free path of the hole. Accordingly, the probability of the hot carrier implant is decreased to about one twentieth by deepening the peak point of the hot carrier generation by 0.014 $\mu$m.

Figure 4:
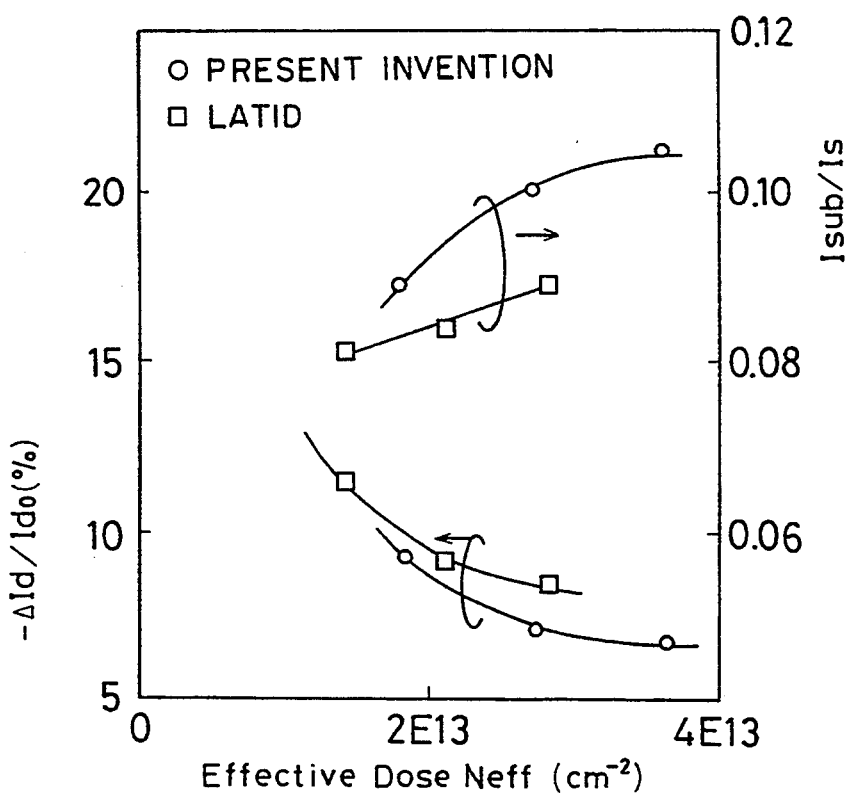
FIG. 4 is a graph showing effective dose ($=$dose$\times$cos $\theta$) dependencies of degradation of drain current Id due to hot carrier and a ratio between substrate current and source current for the MOS transistor according to the first embodiment and the conventional MOS transistor with LATID structure

As to the degradation of the drain current Id due to the hot carrier shown in FIG. 4, the transistors are stressed for 3000 seconds under conditions where drain voltage Vd is 7 V, gate voltage Vg is 2 V and substrate voltage Vsub is $-2$ V, and measured under conditions where drain voltage Vd is 5 V, gate voltage Vg is 0.1 V and substrate voltage Vsub is $-2$ V. The substrate/source current ratio Isub/Is is measured under conditions where drain voltage Vd is 7 V, gate voltage Vg is 2 V and substrate voltage Vsub is $-2$ V. In spite of larger substrate/source current ratio Isub/Is of the MOS transistor in this embodiment than that of the conventional MOS transistor with LATID structure, the degradation property of the drain current Id due to the hot carrier is improved 10%. This 10% improvement corresponds to three to four times longer lifetime.

Figure 5:
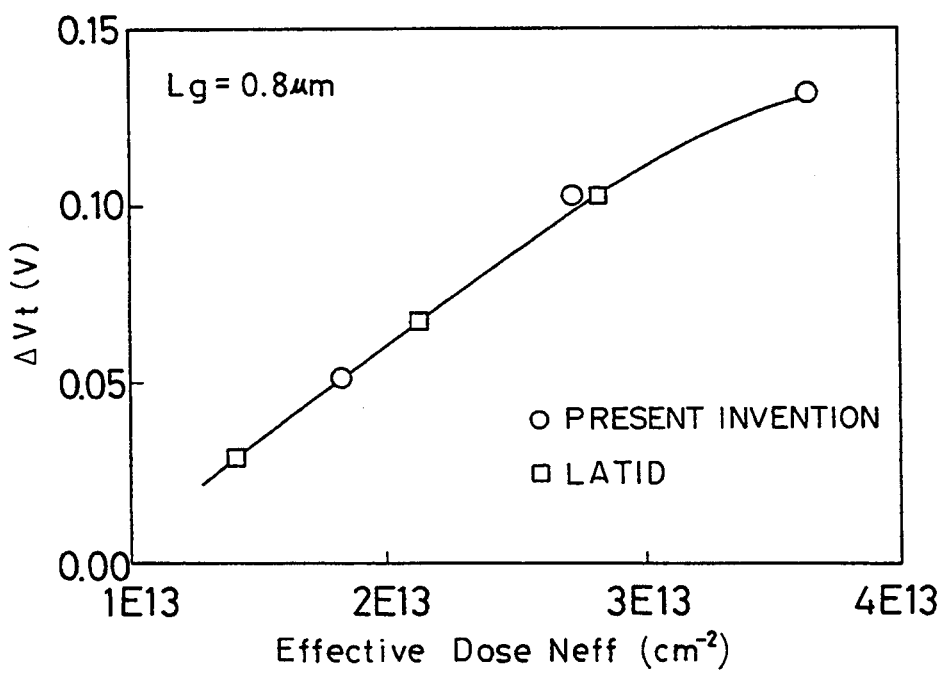
FIG. 5 is graph comparing short channel effect of the MOS transistor according to the first embodiment with the conventional MOS transistor with LATID structure.
Figure 6:
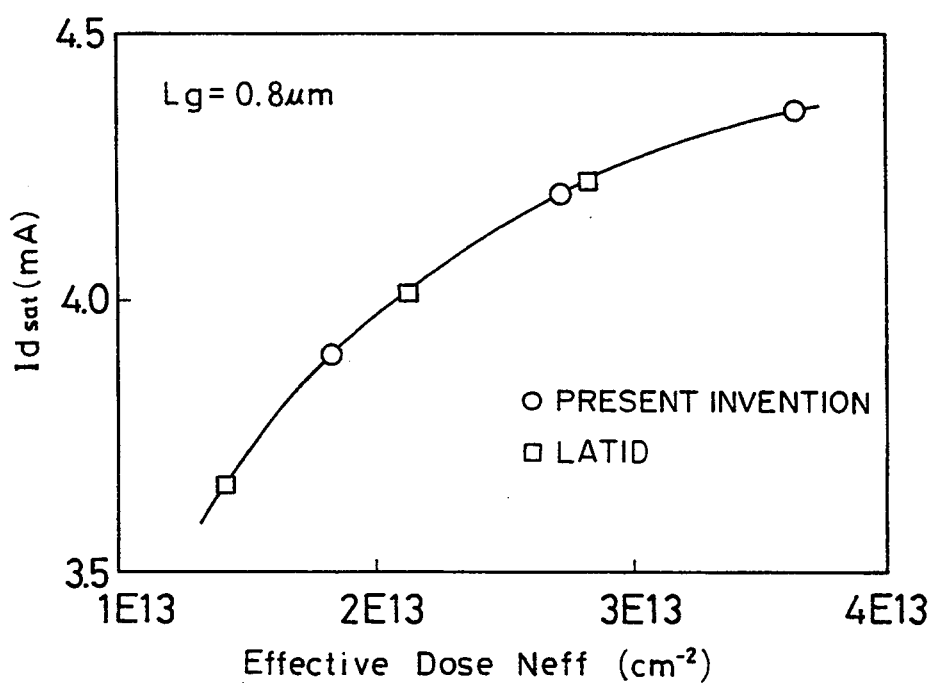
FIG. 6 is a graph comparing drain saturation current of the MOS transistor according to the first embodiment with the conventional MOS transistor with LATID structure.

FIGS. 5 and 6 show the short channel effect and drain saturation current in various effective dose Neff. From the figures, no difference between the MOS transistor in this embodiment and the conventional MOS transistor with LATID structure is seen with respect to the short channel effect and the saturation current under equal effective dose Neff. Consequently, no influence is involved over the current drivability due to high resistivity of the drain under the near-end part of the gate electrode.

Figure 7:
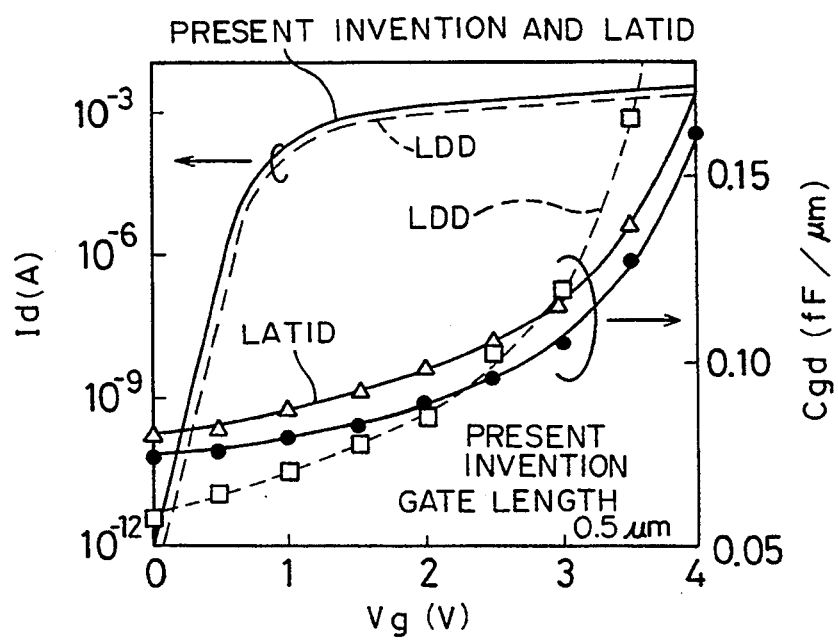
FIG. 7 is a graph showing gate voltage dependencies of a drain saturation current and a capacity between the gate and the drain for the MOS transistor according to the first embodiment, the conventional MOS transistor with LATID structure and a conventional MOS transistor with LDD structure.
Figure 8:
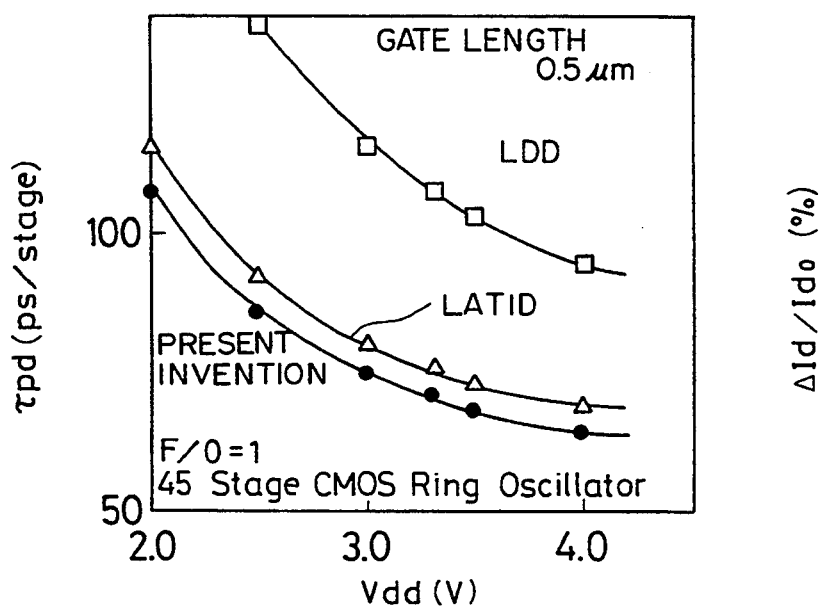
FIG.8 is a graph comparing operation delay time per stage of a ring oscillator in the MOS transistor according to the first embodiment with the conventional MOS transistor with LATID structure and the conventional MOS transistor with LDD structure FIGS. 9(a) and (b) are sections showing processes of manufacturing a MOS transistor according to a second embodiment.

In FIG. 7, the gate/drain overlap length Lov is equal to each other. For comparison, those of the MOS transistor with LDD structure are also shown. As cleared from the figure, the MOS transistor of this embodiment has the equivalent current drivability to and less gate/drain capacity Cgd than that of the conventional MOS transistor with LATID structure. This seems because the impurity atom concentration at the surface region of the lightly doped drain 5 below the gate electrode 3 in the MOS transistor of this embodiment is lower than that in the conventional MOS transistor with LATID structure. As a result, as shown in FIG. 8, an operation speed of the MOS transistor of this embodiment which is applied to a ring oscillator is improved about 10%, compared with that of the conventional MOS transistor with LATID structure.

As described above, according to the first embodiment, by forming the lightly doped source 4 and the lightly doped drain 5 under the gate electrode 3, excellent current drivability can be maintained which is a feature of the conventional MOS transistor with LATID structure. Further, since the effective impurity atom concentration is made gradually lowered from the inside toward the surface of the substrate under the near-end part of the gate electrode 3, the depletion region under the bias is expanded and the gate/drain capacity Cgd is reduced. Thus, the hot-carrier immunity and the operation speed are enhanced without degradation of saturate current characteristic and short channel effect, compared with the conventional transistors with LDD or LATID structures.

As to the MOS transistor with BLDD structure which is based on the LDD structure whose effective atom concentration is made increased from the inside toward the surface in the lightly doped source 4 and lightly doped drain 5 and in which a third region of buried drain having higher impurity atom concentration at the inside is formed, it is apt to cause short channel effect such as punch-through. Also, since the effective impurity atom concentration near the surface is high, the gate/drain capacity is comparatively large to be limited to the improvement in operation speed. In contrast, in the present invention, the MOS transistor is based on the LATID structure where the lightly doped source 4 and the lightly doped drain 5 in the LDD structure are provided under the gate electrode 3, and the impurity atom concentration near the surface thereof is made low. Accordingly, the gate/drain capacity Cgd is reduced. Without the buried drain with comparatively high effective impurity atom concentration, the short channel effect such as punch-through is less occurred.

Particularly, since the effective impurity atom concentration is peaked at a portion 0.01–0.2 $\mu$m deep from the substrate surface, the hot carrier implant to an insulator film is decreased. In other words, since the peak portion is deeper enough than the mean free path of the hot carrier (about 0.005 $\mu$ for the hole), the hot carrier reaches less to the gate oxide layer 2 and the like on the surface side, so that reliability is improved.

In the manufacturing method in this embodiment, no additional manufacturing process is involved to be simplified because only the implant conditions at the formation of the lightly doped source 4 and the lightly doped drain 5 are changed without the number of implant times increased.

SECOND EMBODIMENT

Figure 9A:
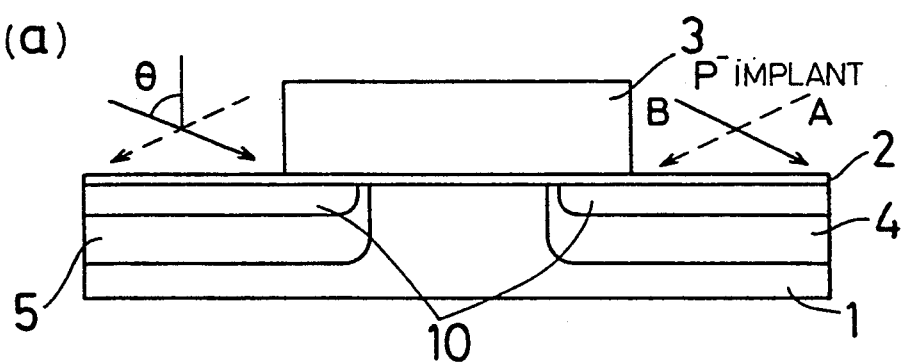

In the second embodiment, a step shown in FIG. 9(a) is carried out between the steps shown in FIGS. 1(b) and (c). In detail, a counter-doping by which, for example, a p-type impurity $BF_2^+$ is implanted under conditions of $\theta=60°$, $D=2\times10^{12}$ cm$^{-2}$, Ei=60 KeV, and Neff=$1\times10^{12}$ cm$^{-2}$ is carried out. In order to form a counter-doped region 10 in the lightly doped source 4 and the lightly doped drain 5, impurity is implanted firstly from the source side (arrow A in broken line), then from the drain side (arrow B in solid line) so that the implanting directions on the source side and the drain side are symmetrical.

As a result, the n-type impurity atom concentration is further lowered in the counter-doped region 10 near the surface in the lightly doped source 4 and the lightly doped drain 5 under the near-end part of the gate electrode 3. The impurity atom concentration profile where the effective impurity atom concentration near the surface is lower than that at the inside thereof under the near-end part of the gate electrode 3 is obtained.

Then, the step as of FIG. 1(c), namely the step to form the side walls 6 is conducted.

Figure 9B:
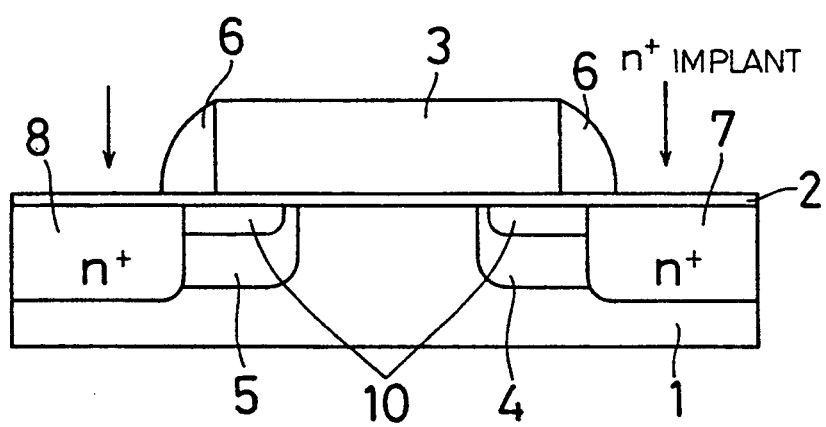

Thereafter, as shown in FIG. 9(b), arsenic ion which is high-concentration n-type impurity is implanted using the gate electrode 3 and the side walls 6 as a mask to form the heavily doped source 7 and the heavily doped drain 8 whose impurity atom concentrations are higher than those of the lightly doped source 4 and the lightly doped drain 5. Finally, the heat treatment at 900° C. is conducted for ten minutes.

Figure 10:
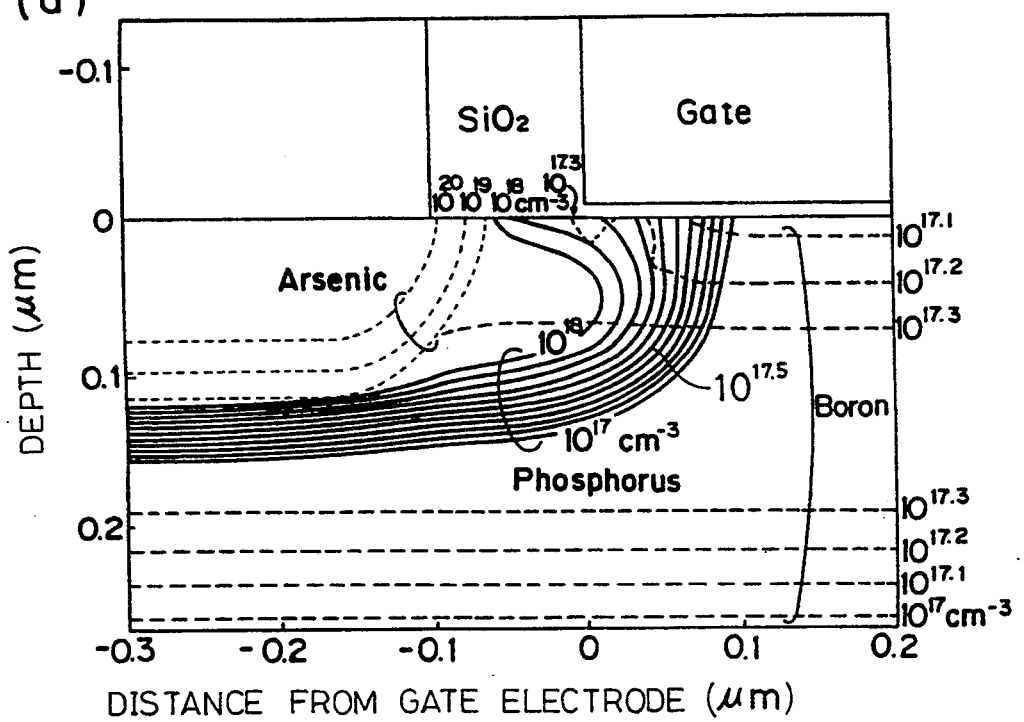
FIGS. 10(a) and (b) are diagrams respectively showing two-dimensional impurity atom concentration profiles near the drain after the processes in the MOS transistor according to the second embodiment and in a MOS transistor without implant of impurity $BF_2^+$ in the second embodiment.
Figure 10:
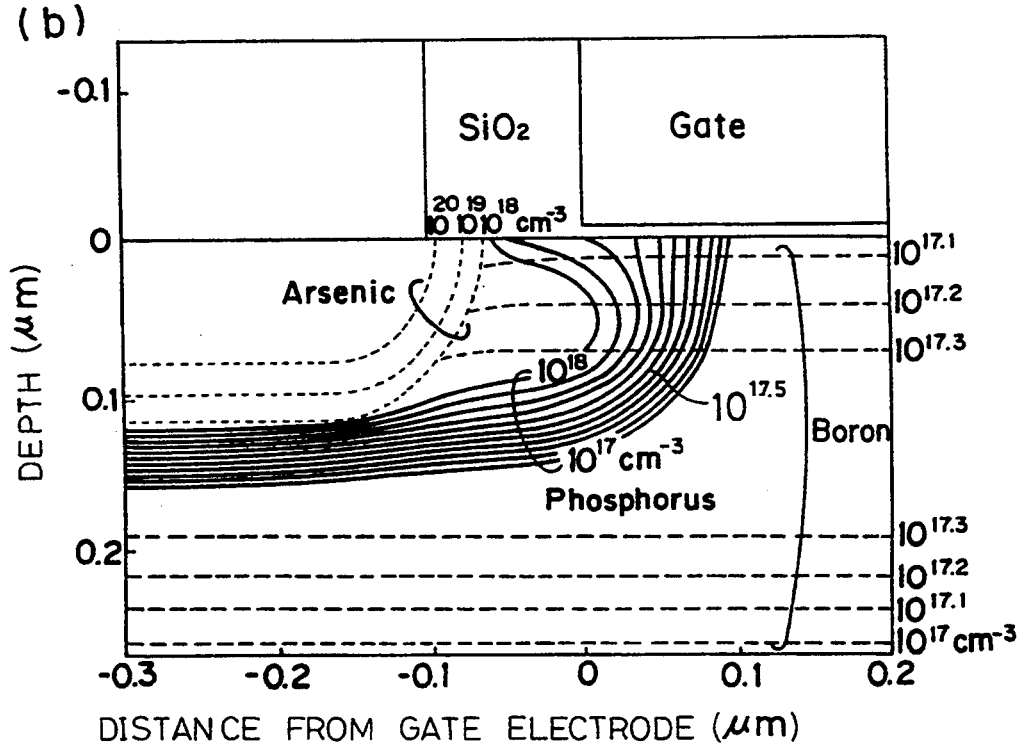

FIG. 10(a) shows a two-dimensional impurity atom concentration profile near the lightly doped drain 5 after the processes, wherein the p-type impurity atom concentration of the substrate is about $1\times10^{17}$ cm$^{-3}$. For comparing with FIG. 10(a), FIG. 10(b) shows a two-dimensional impurity atom concentration profile in case where the p-type impurity $BF_2^+$ is not implanted, namely in case without counter-doping. In FIGS. 10(a) and (b), solid lines indicate phosphorus (n-type impurity) concentration which is effectively low, dotted lines indicate arsenic concentration which is effectively high, and broken lines indicate total amount of concentrations of boron of p-type impurity primarily doped to the substrate 1 and of boron by counter-doping. Comparing FIGS. 10(a) and (b), the n-type impurity atom concentration near the lightly doped drain 5 surface is effectively decreased, since the p-type impurity $BF_2^+$ is counter-doped at an upper part of the lightly doped drain 5 to which the n-type impurity is implanted.

Accordingly, in the second embodiment, the adequate impurity atom concentration profile is obtained by forming the counter doped region 10 and by effectively decreasing the impurity atom concentration near the surface of whole lightly doped source 4 and whole lightly doped drain 5 by means of implanting reverse-conductive type impurity. More adequate impurity atom concentration profile is obtained easily in the second embodiment than in the first embodiment where the impurity atom concentrations of the lightly doped source 4 and the lightly doped drain 5 are adjusted by implanting the one-kind conductive type impurity. Especially, according to lowering of the effective impurity atom concentration at the surface in the lightly doped source 4 and the lightly doped drain 5, the gate/drain capacity Cgd is further reduced.

In the second embodiment, the purity atom concentration is made gradually lowered from the inside toward the surface of the substrate at the formation of the lightly doped source 4 and the lightly doped drain 5, then the counter-doping is conducted for further decreasing the purity atom concentration near the surface. However, the present invention is not limited to the second embodiment. It is possible that the impurity atom concentration near the substrate surface is made comparatively high at the formation of the lightly doped source 4 and the lightly doped drain 5 as in the conventional LATID structure, then the impurity atom concentration near the surface is made lowered by counter-doping. In this case, the lightly doped source 4 and the lightly doped drain 5 is formed easier.

THIRD EMBODIMENT

Figure 11A:
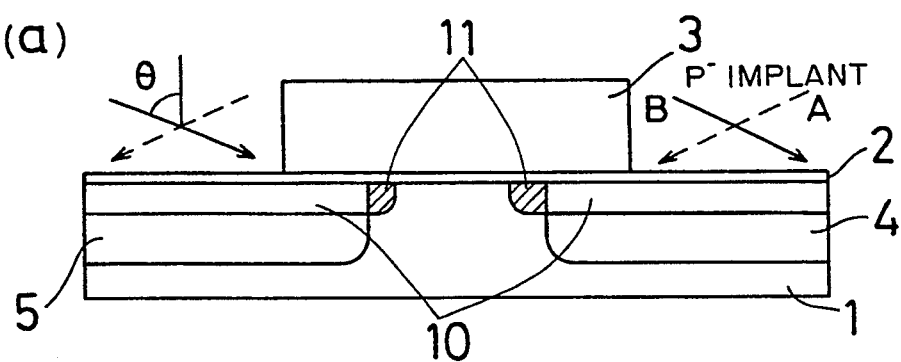
FIGS. 11(a) and (b) are sections showing processes of manufacturing a MOS transistor according to a third embodiment.

In the third embodiment, a step shown in FIG. 11(a) is conducted instead of the implanting step shown in FIG. 9(a) in the second embodiment. For example the p-type impurity $BF_2^+$ is implanted into the lightly doped source 4 and the lightly doped drain 5 under conditions of $\theta=60°$, $D=6\times10^{12}$ cm$^{-2}$, $Ei=60$ keV and $Neff=3\times10^{12}$ cm$^{-2}$ to form at a channel region of the lightly doped source 4 and the lightly doped drain 5 a high-threshold voltage region 11 to which p-type impurity whose atom concentration is higher than that of the p-type impurity of the substrate 1 is implanted.

Thereafter, the side walls are formed as the step shown in FIG. 1(c).

Figure 11B:
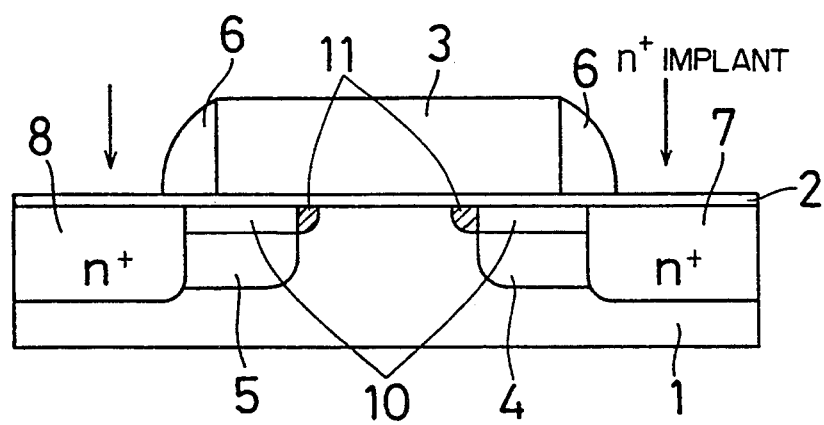

Then, as shown in FIG. 11(b), the heavily doped source 7 and the heavily doped drain 8 are formed in the same manner as in FIG. 9(b).

Figure 12:
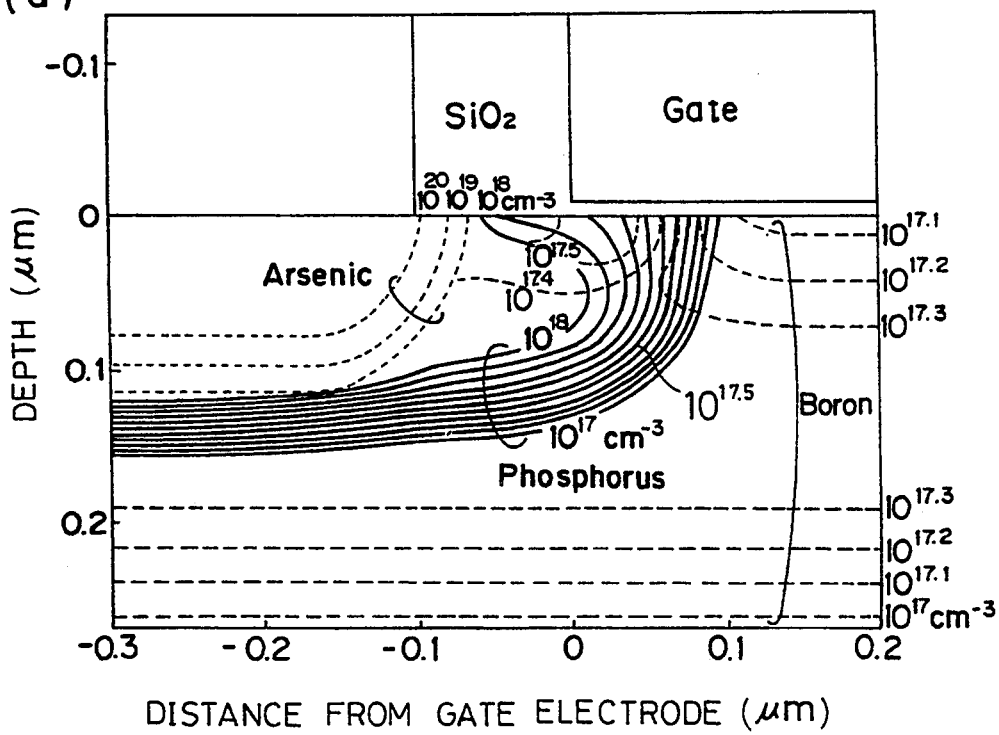
FIGS. 12(a) and (b) are diagrams respectively showing two-dimensional impurity atom concentration profiles near the drain after the processes in the MOS transistor according to the third embodiment and in the MOS transistor without implant of impurity $BF_2^+$ in the third embodiment.
Figure 12:
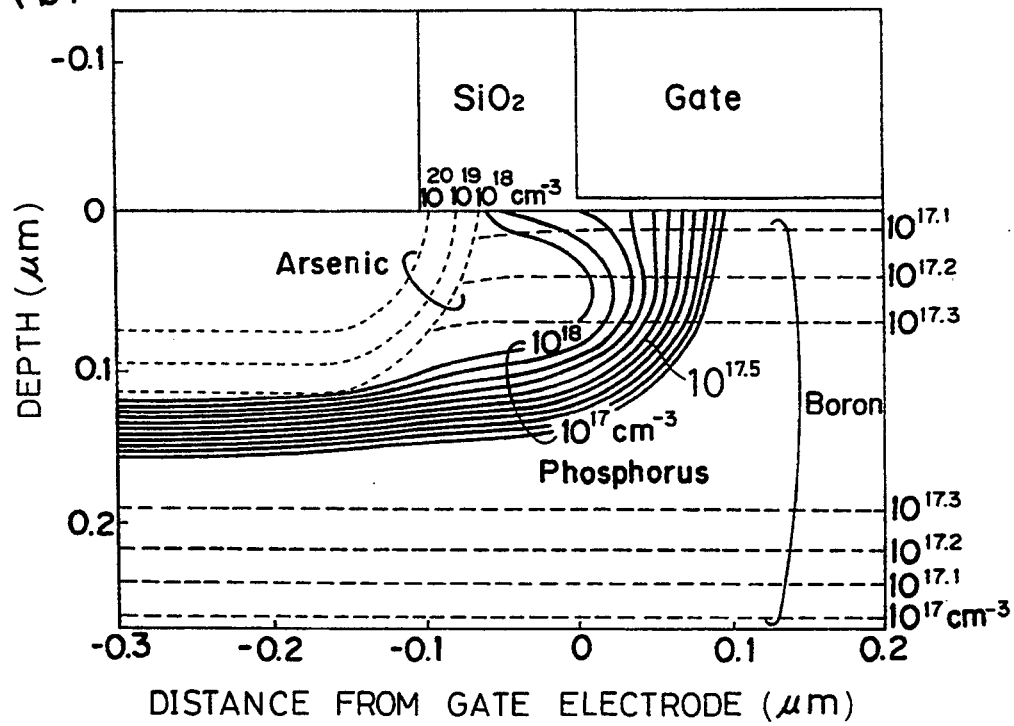
Figure 13:
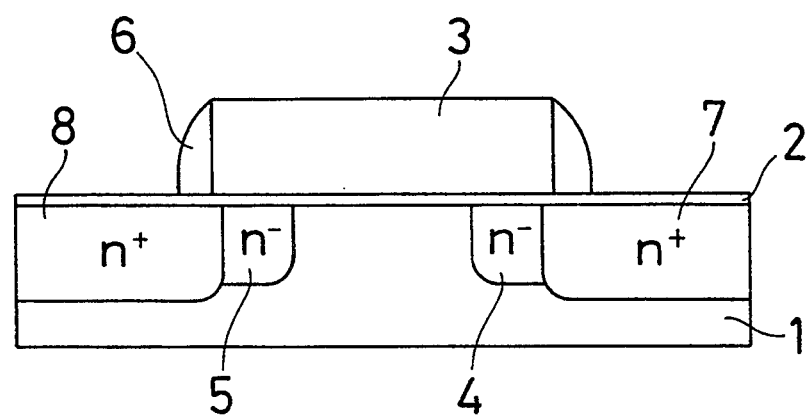
FIG. 13 is a section of the conventional MOS transistor with LATID structure.
Figure 14A:
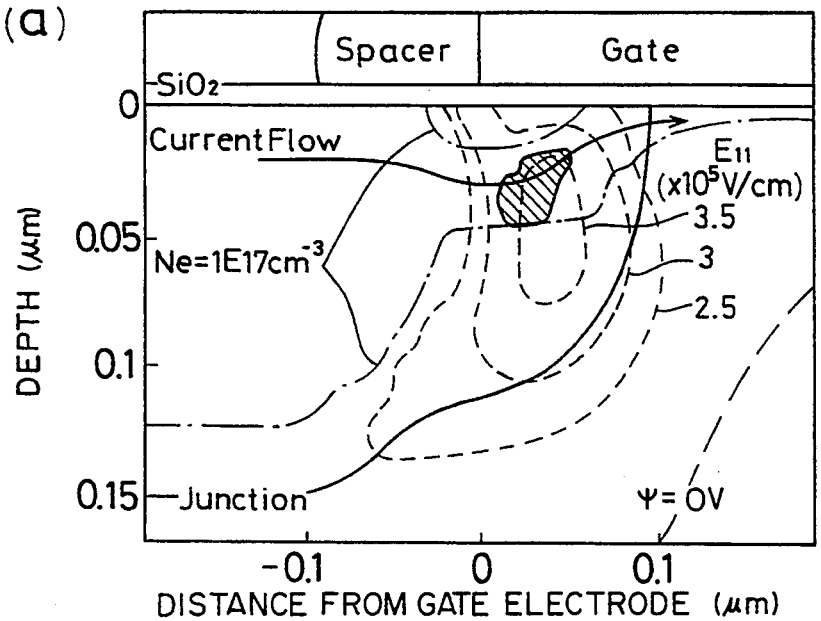
FIGS. 14(a) and (b) are diagrams respectively showing electric field E// in the lateral direction, electron concentration Ne and hot carrier pairs generation frequency Rg obtained by two-dimensional simulation for the conventional transistor with LATID structure and for the conventional MOS transistor with LDD structure.
Figure 14B:
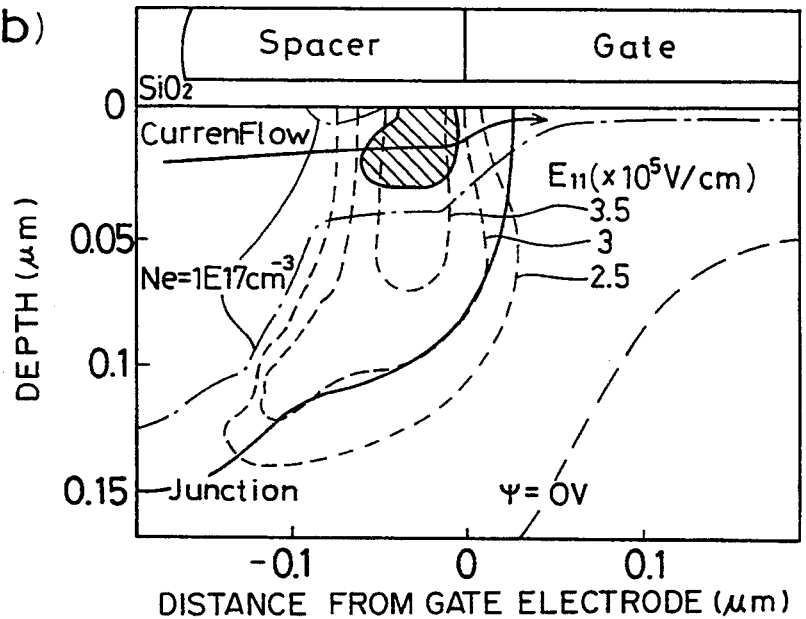
Figure 15:
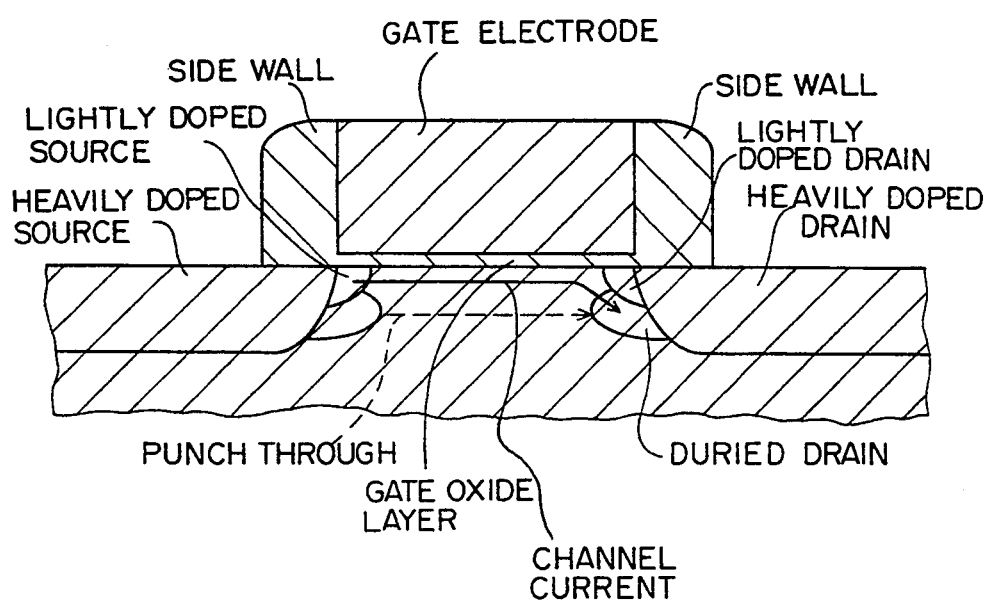
FIG. 15 is a section of a conventional MOS transistor with BLDD structure.
Figure 16:
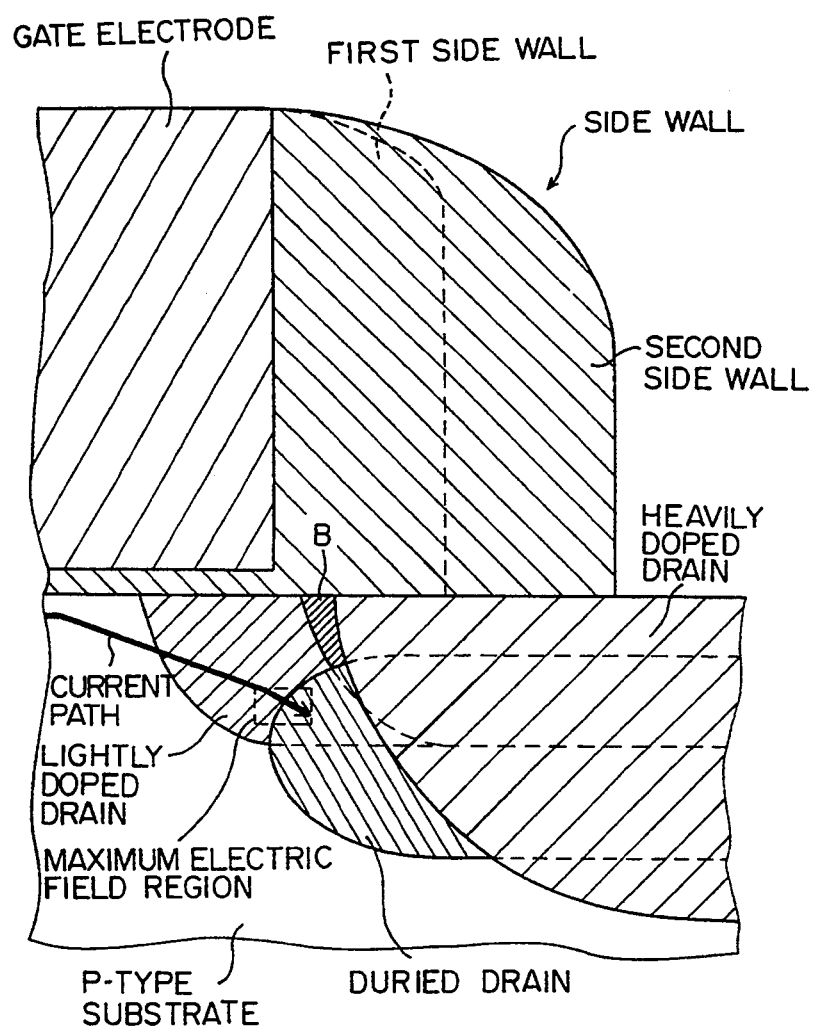
FIG. 16 is a section of a MOS transistor with improved BLDD structure according to U.S. Pat. No. 4,746,624.

FIG. 12(a) shows a two-dimensional impurity atom concentration profile near the lightly doped drain 5 after all processes, wherein the impurity atom concentration of the substrate is about $1\times10^{17}$ cm$^{-3}$. FIG. 12(b) shows for a comparison a two-dimensional impurity atom concentration profile of the lightly doped drain 5 in case without implant of the p-type impurity $BF_2^+$. In each figure, solid lines, dotted lines and broken lines respectively indicate the same impurity atom concentrations as in FIGS. 10(a) and (b). As cleared from FIGS. 12(a) and (b), the impurity atom concentration near the surface of the lightly doped drain 5 is effectively decreased since the reverse-conductive type impurity $BF_2^+$ is counter-doped to the upper part of the lightly doped drain 5. Further, the p-type impurity atom concentration in the channel region aside the lightly doped drain 5 of the lightly doped drain 5 is rather high since the impurity atom concentration at the counter-doping is higher than that of the substrate 1 by this implantation.

In the third embodiment, as described above, the doped high-threshold voltage region which is reverse-conductive type to that in each region 4, 5 and has higher impurity atom concentration than the substrate 1 is formed at the channel region aside of the lightly doped source 4 and the lightly doped drain 5. Consequently, the high-threshold voltage region 11 formed in the channel region aside the lightly doped source 4 and the lightly doped drain 5 partially has high threshold voltage, so that occupation of the high-threshold voltage region 11 to the channel is large accompanied by shortening of the channel length. Thus, the short channel effect, which involves the decrease of the threshold voltage, due to the shortened channel length accompanied by the size reduction of the semiconductor device is softened.

The n-channel type MOS transistor is applied to first, second and third embodiments, but p-channel type MOS transistor is applicable as well. Also, the present invention is not limited to the MOS transistor, and the insulator film may be a nitride silicone film. In short, the present invention is applicable to all types of insulated gate field-effect transistors.

Further, the impurity atom concentration near the surface is made lower than that of the inside under the near-end part of the gate electrode 3 in both the lightly doped source 4 and the lightly doped drain 5, but only one of the lightly doped source 4 and the lightly doped drain 5 may have such a impurity atom concentration.

For taking account of the symmetry between the source and the drain, the two-step wise implant is applied to the impurity implant to the lightly doped source 4 and the lightly doped drain 5 in first, second and third embodiments and to the counter-doping in second and third embodiments. However, the gate in the semiconductor device must be fixed in one direction in order to save the number of manufacturing steps, which causes a strict limitation to the circuit layout. Accordingly, it is preferable to apply a four-step wise implant thereto in order to be possible to arrange the gate in both vertical and lateral directions.

In case where the p-channel type MOS transistor is installed with the n-channel type MOS transistor to the semiconductor device in the present invention for using a CMOS circuit, it is preferable to use the counter-doping in second and third embodiments for forming the lightly doped source and the lightly doped drain when the p-channel type MOS transistor is made to have the LATID structure because the masking step can be omitted.

We claim:

1. A semiconductor device functioning as an insulated gate field-effect transistor, comprising:
    a semiconductor substrate;
    a heavily doped source region and a heavily doped drain region formed in said semiconductor substrate, each of which has a polarity type opposite that of the semiconductor substrate; and
    a lightly doped source region and a lightly doped drain region formed adjacent to the heavily doped source region and the heavily doped drain region, respectively, at least a part of said lightly doped source and drain regions extending under a near-end part of a gate electrode formed over said semiconductor substrate, the lightly doped source region and the lightly doped drain region being of the same polarity type as the heavily doped source region and the heavily doped drain region, and having a lower impurity concentration than that of the heavily doped source region and the heavily doped drain region;
    wherein the impurity concentration of the portion under the near-end part of the gate electrode in at least one of the lightly doped source region and the lightly doped drain region is continuously reduced from a maximum level as the vertical distance to the gate electrode decreases.

2. The semiconductor device according to claim 1, wherein in a region of the lightly doped source region and the lightly doped drain region where the impurity concentration is continuously reduced from the inside of the substrate toward the surface thereof, the impurity concentration is at a maximum at a distance of 0.01 to 0.2 $\mu$m deep from the semiconductor substrate surface.

3. The semiconductor device according to claims 1 or 2, further comprising a high-threshold voltage region having the same polarity type as the semiconductor substrate and having a higher impurity concentration than the substrate, said high-threshold voltage region is formed at a region near the surface of the substrate which connects a channel of the transistor to the portion under the near-end part of the gate electrode aside at least one of the lightly doped source region and the lightly doped drain region.

4. The semiconductor device according to claim 1, wherein the impurity concentration of said lightly doped source region and said lightly doped drain region is continuously reduced from the maximum impurity concentration level in the directions toward and opposite the surface of the semiconductor substrate.

* * * * *